(12) United States Patent
Tomonari et al.

(10) Patent No.: US 9,768,154 B2
(45) Date of Patent: Sep. 19, 2017

(54) SEMICONDUCTOR PACKAGE AND MANUFACTURING METHOD THEREFOR

(71) Applicant: TDK Corporation, Tokyo (JP)

(72) Inventors: Toshio Tomonari, Tokyo (JP); Hirohumi Asou, Tokyo (JP); Hisayuki Abe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/271,521

(22) Filed: Sep. 21, 2016

(65) Prior Publication Data

US 2017/0092633 A1    Mar. 30, 2017

(30) Foreign Application Priority Data

Sep. 25, 2015   (JP) .................. 2015-187796

(51) Int. Cl.
| | |
|---|---|
| *H01L 23/552* | (2006.01) |
| *H01L 25/18* | (2006.01) |
| *H01L 21/56* | (2006.01) |
| *H01L 23/29* | (2006.01) |
| *H01L 23/31* | (2006.01) |
| *H01L 25/00* | (2006.01) |

(52) U.S. Cl.
CPC ............ *H01L 25/18* (2013.01); *H01L 21/561* (2013.01); *H01L 23/29* (2013.01); *H01L 23/3128* (2013.01); *H01L 23/3135* (2013.01); *H01L 23/552* (2013.01); *H01L 25/50* (2013.01)

(58) Field of Classification Search
USPC ................. 257/100, E23.042, 678–733, 257/E25.031–E25.032, 433, 434, 667, 257/787–796, E31.117–E31.118, E51.02, 257/E23.116–E23.14; 438/15, 25, 26, 51, 438/55, 64–67, 112, 124, 126, 127
See application file for complete search history.

(56) References Cited

U.S. PATENT DOCUMENTS

| 2015/0061095 A1* | 3/2015 | Choi .................. H01L 24/20 |
| | | 257/675 |
| 2016/0218082 A1* | 7/2016 | Lee ................... H01L 24/20 |
| 2016/0262292 A1* | 9/2016 | Kuk .................. H01L 23/24 |

FOREIGN PATENT DOCUMENTS

JP        H03-126250 A     5/1991

* cited by examiner

*Primary Examiner* — Tram H Nguyen
(74) *Attorney, Agent, or Firm* — Young Law Firm, P.C.

(57) ABSTRACT

Disclosed herein is a semiconductor package that includes: a package substrate having a main surface; a plurality of semiconductor devices mounted on the main surface of the package substrate; a mold member formed on the main surface of the package substrate so as to cover the semiconductor devices, the mold member having an upper surface substantially parallel to the main surface of the package substrate; and an electromagnetic wave shield formed on the upper surface of the mold member. The mold member comprises a mold resin and metal magnetic particles dispersed in the mold resin. The metal magnetic particles are exposed to the upper surface of the mold member.

16 Claims, 13 Drawing Sheets

SEMICONDUCTOR PACKAGE AND MANUFACTURING METHOD THEREFOR

BACKGROUND OF THE INVENTION

Field of the Invention

The present invention relates to a semiconductor package and a manufacturing method therefor and, more particularly, to a semiconductor package obtained by dispersing metal magnetic particles in a mold resin covering a semiconductor device such as an IC and a manufacturing method therefor.

Description of Related Art

Recently, in mobile information terminals such as smartphones, a semiconductor package called system-in-package (SiP) is widely used. The SiP is a technology that allows an IC and a large number of electronic components to be mounted in one semiconductor package as one functional block. Such a semiconductor package is applied with countermeasures against electromagnetic wave noise so as not to malfunction due to external noise and not to allow the semiconductor package itself to be a noise source. Although not related to the SiP, Japanese Patent Application Laid-Open No. 1991-126250 discloses a semiconductor package obtained by dispersing ferrite powder in a mold resin.

However, in recent years, along with improvement in communication speed, a demand has arisen for realization of a higher noise shielding effect, and it is difficult to obtain a sufficient noise shielding effect only by dispersing the ferrite powder in a mold resin. In addition, mobile information terminals such as smartphones are highly required to achieve not only function enhancement, but also a reduction in height and thus have a requirement to reduce a thickness of the mold resin. This may lead to a reduction in the noise shielding effect.

SUMMARY

It is therefore an object of the present invention to provide a semiconductor package capable of achieving a reduction in height and obtaining a high noise shielding effect and a manufacturing method for the semiconductor package.

The present inventors have studied a method of dispersing metal magnetic particles having a high permeability in a mold resin for the purpose of improving a noise shielding effect of the semiconductor package. The study revealed that dispersing the metal magnetic particles having a high permeability allows achievement of a higher noise shielding effect; however, it was found that when a process of lapping the mold resin is added to reduce the height of a semiconductor package, the metal magnetic particles are exposed from the mold resin, which may result in falling-off of the metal magnetic particles from the mold resin. The metal magnetic particles have a high conductivity, so that when they fall off from the semiconductor package, short-circuit of a wiring on a printed board and the like may occur to deteriorate reliability.

The present inventors came to the conclusion that when the mold resin in which the metal magnetic particles have been dispersed is reduced in thickness by lapping or grinding, it is necessary to prevent the falling-off of the metal magnetic particles by covering, using a member of some sort, a mold surface to which the metal magnetic particles are exposed. Further, it was found that selecting a material functioning as an electromagnetic wave shield as the material covering the mold surface makes it possible not only to prevent the falling-off of the metal magnetic particles but also to achieve a higher noise shielding effect.

The present invention has been made in view of such technical findings, and a semiconductor package according to the present invention includes: a package substrate; a plurality of semiconductor devices mounted on a main surface of the package substrate; a mold member formed on the main surface of the package substrate so as to cover the plurality of semiconductor devices and having an upper surface substantially parallel to the main surface of the package substrate; and an electromagnetic wave shield formed on the upper surface of the mold member. The mold member is obtained by dispersing metal magnetic particles in a mold resin, and the metal magnetic particles are exposed to the upper surface of the mold member.

According to the present invention, the mold surface to which the metal magnetic particles are exposed is covered by the electromagnetic wave shield, so that it is possible to prevent falling-off of the metal magnetic particles exposed due to a reduction in height and to achieve a higher noise shielding effect. In particular, electromagnetic wave noise radiated from the semiconductor device passes through the mold resin in which the metal magnetic particles have been dispersed and reaches the electromagnetic wave shield, so that a high noise shielding effect can be obtained. Further, selecting metal as a material for the electromagnetic wave shield allows achievement of a secondary effect that makes the electromagnetic wave shield harder to come off due to tight adhesion with the exposed metal magnetic particles.

Preferably, in the present invention, the mold member further has side surfaces substantially perpendicular to the main surface of the package substrate, the metal magnetic particles are exposed also to the side surfaces of the mold member, and the electromagnetic wave shield is formed also on the side surfaces of the mold member. With this configuration, it is possible to prevent falling-off of the metal magnetic particles from side surfaces of the semiconductor package and to achieve a high noise shielding effect also on the side surfaces of the semiconductor package.

In the present invention, the plurality of semiconductor devices preferably include a first semiconductor device constituting a first functional block that may be a source of electromagnetic wave noise and a second semiconductor device constituting a second functional block including an analog circuit whose signal processing characteristics can be deteriorated by the electromagnetic wave noise. The first and second functional blocks may both be a power amplifier, or the first and second functional blocks may be a memory and a power amplifier, respectively. When a plurality of functional blocks are integrated in the semiconductor package, more functions can be achieved; whereas a problem that electromagnetic wave noise radiated from one functional block affects another functional block may occur. However, according to the present invention, the mold member itself has high electromagnetic wave noise absorbing performance, so that electromagnetic wave noise reflected by the electromagnetic wave shield can be sufficiently attenuated.

Preferably, in the present invention, the metal magnetic particles each have a flat shape and are dispersed in the mold resin such that a planar direction thereof is substantially parallel to the main surface of the package substrate. With this configuration, permeability in the horizontal direction becomes low, so that radiated electromagnetic wave noise can be led in the horizontal direction for attenuation. Alternatively, the metal magnetic particles each have a spherical shape. In this case, it is possible to obtain the effect of making the metal magnetic particles harder to be magnetically saturated.

Preferably, in the present invention, the electromagnetic wave shield is a metal film formed by plating. With this configuration, it is possible to form an electromagnetic shield by electroless plating using a plating solution containing no catalyst.

A semiconductor package manufacturing method according to the present invention includes a step of mounting a plurality of semiconductor devices on a main surface of a package substrate; a step of forming, on the main surface of the package substrate, a mold member obtained by dispersing metal magnetic particles in a mold resin so as to cover the plurality of semiconductor devices; a step of grinding an upper surface of the mold member parallel to the main surface of the package substrate to expose the metal magnetic particles to the upper surface; and a step of covering the upper surface of the mold member by an electromagnetic wave shield.

According to the present invention, the semiconductor package can be reduced in height. Further, the metal magnetic particles exposed in the height reduction process are covered by the electromagnetic wave shield, falling off of the metal magnetic particles can be prevented.

The semiconductor package manufacturing method according to the present invention preferably further includes a step of dicing the mold member to expose the metal magnetic particles to side surfaces of the mold member perpendicular to the main surface of the package substrate, and the step of covering the upper surface of the mold member by the electromagnetic wave shield preferably covers further the side surfaces of the mold member. With this configuration, it is possible to prevent the metal magnetic particles from falling off from the side surfaces of the semiconductor package and to achieve a high noise shielding effect also on the side surfaces of the semiconductor package.

In the present invention, the step of covering the upper surface of the mold member by the electromagnetic wave shield is preferably performed by electroless plating. With this configuration, the surface of the mold member can be covered by a uniform metal film. In this case, the electroless plating can be performed using a plating solution containing no catalyst. This is because the metal magnetic particles exposed to the mold surface serve as a catalyst.

As described above, according to the present invention, there can be provided a semiconductor package capable of achieving a reduction in height and obtaining a high noise shielding effect and a manufacturing method for the semiconductor package.

BRIEF DESCRIPTION OF THE DRAWINGS

The above features and advantages of the present invention will be more apparent from the following description of certain preferred embodiments taken in conjunction with the accompanying drawings, in which:

FIGS. 3A and 3B are enlarged views of a region A illustrated in FIG. 1, where FIG. 3A illustrates an example in which spherical metal magnetic particles are used, and FIG. 3B illustrates an example in which flat metal magnetic particles are used;

FIGS. 12A and 12B are an enlarged cross-sectional view of a region B illustrated in FIG. 7, where FIG. 12A shows a state immediately after molding, and FIG. 12B shows a state after lapping.

DETAILED DESCRIPTION OF THE EMBODIMENTS

Preferred embodiments of the present invention will be explained below in detail with reference to the accompanying drawings.

Figure 1:
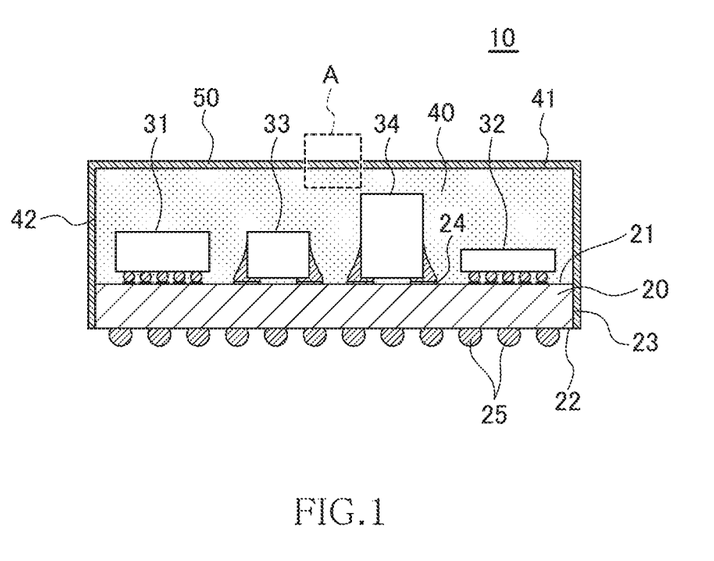
FIG. 1 is a cross-sectional view for explaining a structure of a semiconductor package according to a preferred embodiment of the present invention.

FIG. 1 is a cross-sectional view for explaining a structure of a semiconductor package 10 according to a preferred embodiment of the present invention.

As illustrated in FIG. 1, a semiconductor package 10 according to the present embodiment includes a package substrate 20, semiconductor devices 31, 32 and chip components 33, 34 which are mounted on a main surface 21 of the package substrate 20, a mold member 40 formed on the main surface 21 of the package substrate 20 so as to cover the semiconductor devices 31, 32 and chip components 33, 34, and an electromagnetic wave shield 50 formed on a surface of the mold member 40 and side surfaces 23 of the package substrate 20. In the following description, when need not be distinguished from one another, the semiconductor devices 31, 32 and chip components 33, 34 will be referred to, sometimes collectively, as mounting components 31 to 34.

The package substrate 20 is a single- or multi-layer circuit board made of an insulating material such as a glass epoxy, a BT resin, or alumina. The package substrate 20 has land patterns 24 for connection to the mounting components 31 to 34 on the main surface 21, and has external terminals 25 on a rear surface 22. The land patterns 24 and external terminals 25 are connected to each other through an unillustrated through-hole conductor formed so as to penetrate the package substrate 20.

The semiconductor devices 31, 32 are each a bare chip IC or a packaged IC. The IC type is not particularly limited and may be: an analog IC, such as a power amplifier that amplifies, modulates, or demodulates a receiving signal; a processor IC such as a CPU or a DSP; or a memory IC such as a DRAM or a flashmemory. The processor IC and memory IC are sometimes stacked on each other. The chip components 33, 34 are each a discrete semiconductor device such as a transistor, or a passive element such as a capacitor or a coil.

The mold member 40 is obtained by dispersing metal magnetic particles in a mold resin and has an upper surface 41 parallel to the main surface 21 of the package substrate 20 and side surfaces 42 perpendicular to the main surface 21. Although details will be described later, the metal magnetic particles are exposed to the upper surface 41 and side surfaces 42 of the mold member 40. As a mold resin constituting the mold member 40, a thermosetting epoxy resin may be used.

The electromagnetic wave shield 50 is formed so as to cover the upper surface 41 and side surfaces 42 of the mold member 40 and side surfaces 23 of the package substrate 20. Although a material of the electromagnetic wave shield 50 is not particularly limited, a metal film is preferably used, and more preferably, a single-layer film of Cu or Ni or a laminated film of Ni and Cu may be used.

Figure 2A:
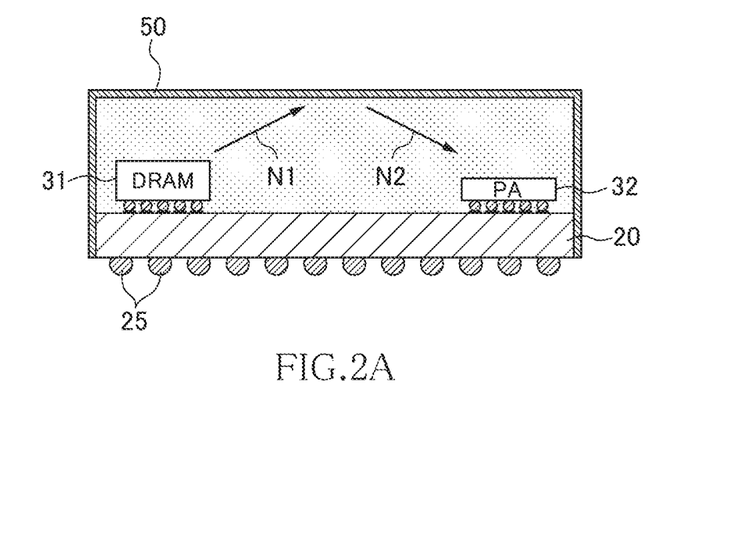
FIGS. 2A and 2B are exemplary views for explaining electromagnetic wave noise inside the semiconductor package shown in FIG. 1.
Figure 2B:
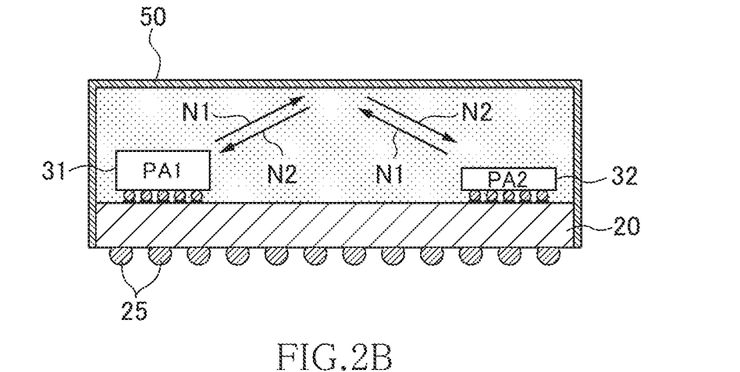

FIGS. 2A and 2B are exemplary views for explaining electromagnetic wave noise inside the semiconductor package 10.

In an example illustrated in FIG. 2A, one semiconductor device 31 is a memory IC (e.g., DRAM) and the other semiconductor device 32 is an analog IC (e.g., power amplifier). The memory IC, especially, a DRAM operating on a high clock frequency may become an electromagnetic wave noise radiation source. In this case, part of radiated noise (N1) is reflected by the electromagnetic wave shield 50 and some times reaches the analog IC (N2). The analog IC includes an analog circuit whose signal processing characteristics are deteriorated by electromagnetic wave noise. Thus, when the analog IC is a power amplifier (PA), reception sensitivity thereof may be deteriorated. Although the analog IC also radiates the electromagnetic wave noise, the memory IC is hardly affected by the electromagnetic wave noise.

In an example illustrated in FIG. 2B, the semiconductor devices 31, 32 are both an analog IC (e.g., power amplifiers). In this case, electromagnetic wave noise radiated from the semiconductor devices 31, 32 affect each other. That is, part of noise (N1) radiated from the semiconductor device 31 (power amplifier PA1) is reflected by the electromagnetic wave shield 50 and reaches the semiconductor device 32 (power amplifier PA2) (N2), and at the same time, part of noise (N1) radiated from the semiconductor device 32 (power amplifier PA2) also is reflected by the electromagnetic wave shield 50 and reaches the semiconductor device 31 (power amplifier PA1) (N2).

Thus, in a case where a plurality of functional blocks are integrated in one semiconductor package 10, mutual interference of electromagnetic wave noise occurs between the functional blocks. The functional block refers to a circuit group for realizing a unit function (power amplifier function, memory function, etc.) generally integrated in one semiconductor package.

As described above, in the semiconductor package 10 according to the present embodiment, the metal magnetic particles are contained in the mold member 40 for the purpose of suppressing the mutual interference of electromagnetic wave noise. This significantly attenuates the radiated electromagnetic wave noise (N1) and reflected electromagnetic wave noise (N2) upon passage of the noise N1 and noise N2 through the mold member 40, thereby allowing the mutual interference of electromagnetic wave noise to be effectively suppressed.

Further, in the semiconductor package 10 according to the present embodiment, after formation of the mold member 40, the upper surface 41 of the mold member 40 is ground. As a result, a reduction in thickness of the mold member 40 is achieved.

Figure 3A:
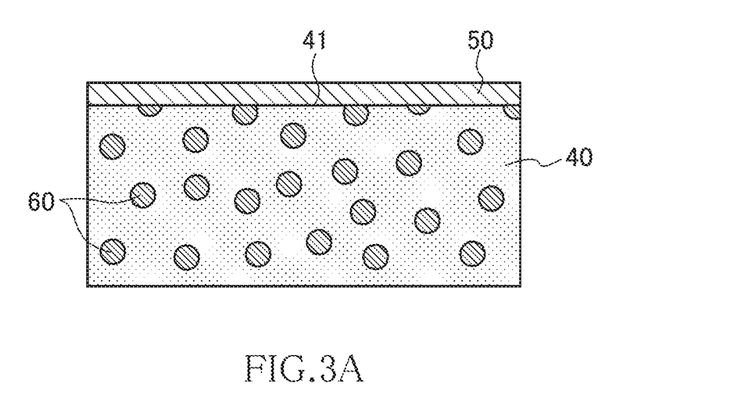
Figure 3B:
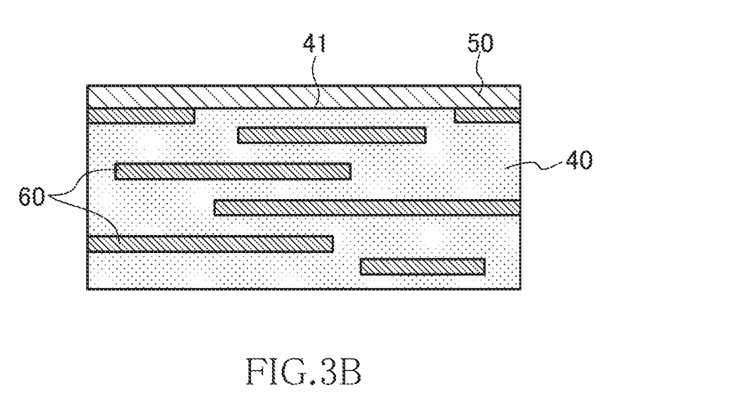

FIGS. 3A and 3B are enlarged views of a region A illustrated in FIG. 1. FIG. 3A illustrates an example in which spherical metal magnetic particles are used, and FIG. 3B illustrates an example in which flat metal magnetic particles are used.

As illustrated in FIGS. 3A and 3B, the metal magnetic particles 60 a part of each of which has been removed by grinding are exposed to the upper surface 41 of the mold member 40. Thus, the electromagnetic wave shield 50 covering the upper surface 41 of the mold member 40 is brought into contact with the exposed metal magnetic particles 60 without an intervention of a dielectric material. Although not particularly limited, the metal magnetic particles 60 may each preferably be made of a permalloy (Fe—Ni alloy), a super permalloy (Fr—Ni—Mo alloy), a sendust (Fe—Si—Al alloy), an Fe—Si alloy, an Fe—Co alloy, an Fe—Cr alloy, or an Fe—Cr—Si alloy.

In the present embodiment, the metal magnetic particles 60 are exposed to the upper surface 41 of the mold member 40, so that if the electromagnetic wave shield 50 is absent, the exposed metal magnetic particles 60 may fall off from the mold member 40. When the metal magnetic particles 60, which have a high conductivity, fall off, short-circuit of a wiring on the printed board and the like may occur to deteriorate reliability. However, in the present embodiment, the upper surface 41 of the mold member 40 is covered by the electromagnetic wave shield 50, so that it is possible to reliably prevent falling-off of the metal magnetic particles 60. In addition, the metal magnetic particles 60 are highly adhesive to the electromagnetic wave shield 50, so that a separation-preventing effect of the electromagnetic wave shield 50 can also be enhanced.

The shape of each metal magnetic particle 60 is not particularly limited. For example, the metal magnetic particles 60 may each have a spherical shape (see FIG. 3A) or a flat shape (see FIG. 3B). Using the spherical metal magnetic particles 60 allows achievement of high magnetic saturation characteristics. The diameter of each of the metal magnetic particles 60 is not particularly limited; however, in order to achieve both the magnetic saturation characteristics and permeability, the diameter is preferably set to about 20 μm to 40 μm, and more preferably, to about 30 μm.

When the flat metal magnetic particles 60 are used, the metal magnetic particles 60 are preferably dispersed in the mold resin such that a planar direction thereof is parallel to the main surface 21 of the package substrate 20. As a result, electromagnetic wave noise radiated from the semiconductor devices 31, 32 is led in the horizontal direction, making it difficult for the electromagnetic wave noise to be transmitted in the vertical direction. That is, much noise can be attenuated before the noise reaches the electromagnetic wave shield 50.

As described above, the metal magnetic particles 60 are contained in the mold member 40, so that electromagnetic wave noise radiated from the semiconductor devices 31, 32 is absorbed by the mold member 40 to be significantly attenuated. Then, much of noise transmitted through the mold member 40 is shielded by the electromagnetic wave shield 50. As a result, the amount of the electromagnetic wave noise to be radiated to the outside of the semiconductor package 10 becomes very small.

The electromagnetic wave noise (see N2 of FIGS. 2A and 2B) reflected by the electromagnetic wave shield 50 is absorbed by the metal magnetic particles 60 once again, so that the amount of the electromagnetic wave noise to reach the semiconductor devices 31, 32 also becomes very small. For example, in the example of FIG. 2A, the electromagnetic wave noise radiated from the memory semiconductor device 31 and reflected by the electromagnetic wave shield 50 is attenuated by the metal magnetic particles 60 once again, so that the amount of the electromagnetic wave noise to reach the analog semiconductor device 32 becomes very small. Similarly, in the example of FIG. 2B, mutual interference of the electromagnetic wave noise radiated from the semiconductor devices 31, 32 is significantly suppressed.

The following describes a manufacturing method for the semiconductor package 10 according to the present embodiment.

Figure 4:
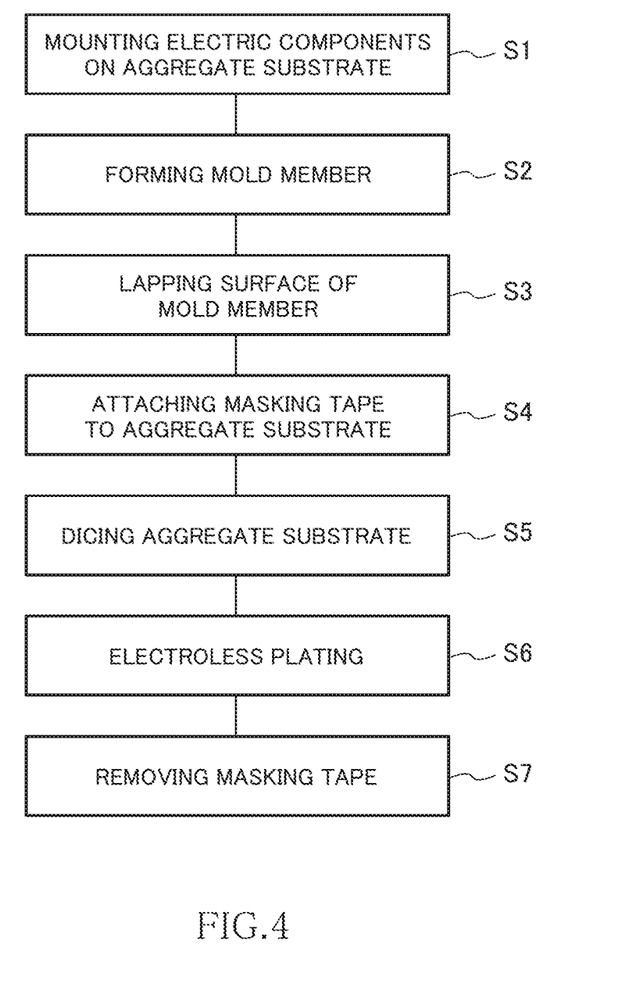
FIG. 4 is a flowchart for explaining the manufacturing method for the semiconductor package shown in FIG. 1.

FIG. 4 is a flowchart for explaining the manufacturing method for the semiconductor package 10, and FIGS. 5 to 11 are each a cross-sectional view in each step of the manufacturing method.

Figure 5:
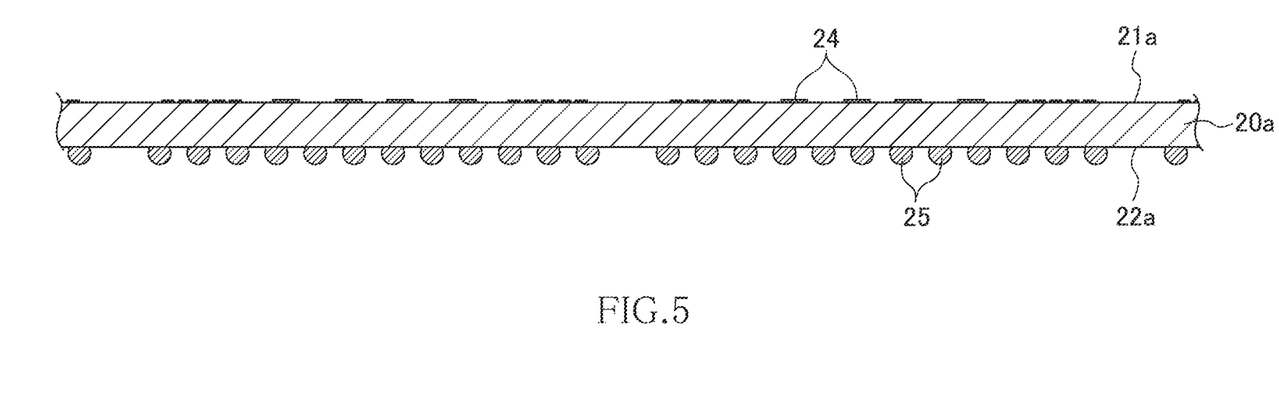
FIGS. 5 to 11 are cross-sectional views in each step of the manufacturing method.
Figure 6:
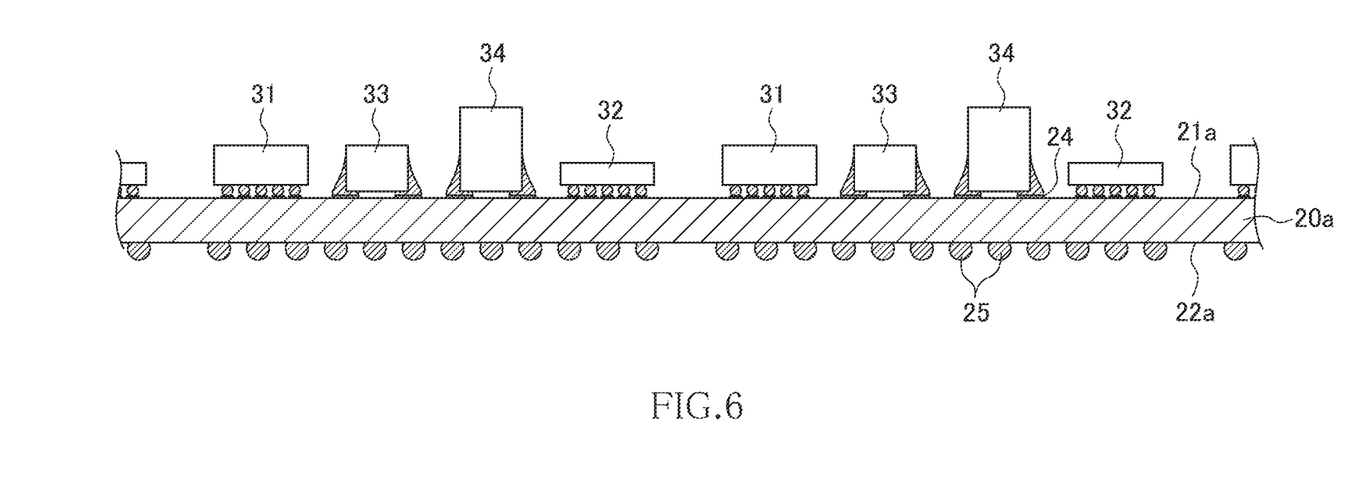

First, as illustrated in FIG. 5, an aggregate substrate 20a is prepared, and land patterns 24 and external terminals 25 are formed on a main surface 21a and a rear surface 22a, respectively, of the aggregate substrate. The aggregate substrate 20a is a substrate of a large area for taking multiple semiconductor packages 10 therefrom. The external terminal 25 need not be formed in this step but may be formed in any of the subsequent steps. Subsequently, as illustrated in FIG. 6, the mounting components 31 to 34 are mounted on the aggregate substrate 20a so as to be electrically connected to predetermined land patterns 24 (step S1). Specifically, the mounting components 31 to 34 are disposed using a mounter after feeding solder to the land patterns 24 and are thereafter subjected to batch reflow soldering.

Figure 7:
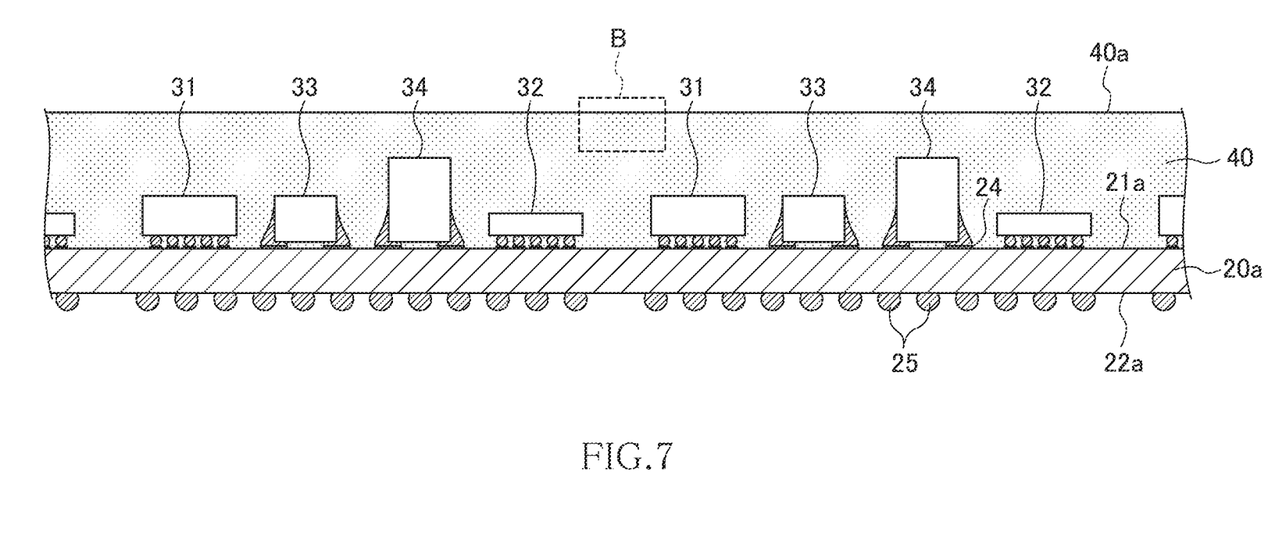

Then, as illustrated in FIG. 7, the mold member 40 is formed on the main surface 21a of the aggregate substrate 20a so as to cover the mounting components 31 to 34 (step S2). Specifically, the mold member 40 is formed by supplying a tablet containing the metal magnetic particles 60 in an insulating resin formed of a thermosetting epoxy resin to a die. When the metal magnetic particles 60 each have a flat shape, the planar direction thereof naturally becomes parallel to the main surface 21a by the gravitational action.

Figure 12A:
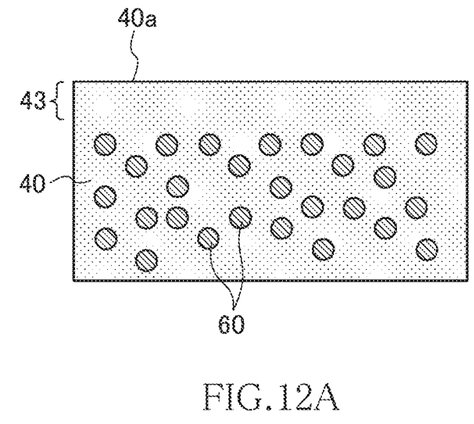

FIG. 12A is an enlarged cross-sectional view of a region B illustrated in FIG. 7. In the example of FIG. 12A, the metal magnetic particles 60 each having a spherical shape are used. As illustrated in FIG. 12A, the metal magnetic particles 60 hardly exist in a surface layer 43 of the mold member 40 immediately after the molding, and the surface layer 43 includes only the mold resin. Thus, there are few metal magnetic particles 60 exposed to a surface 40a in this stage.

Figure 8:
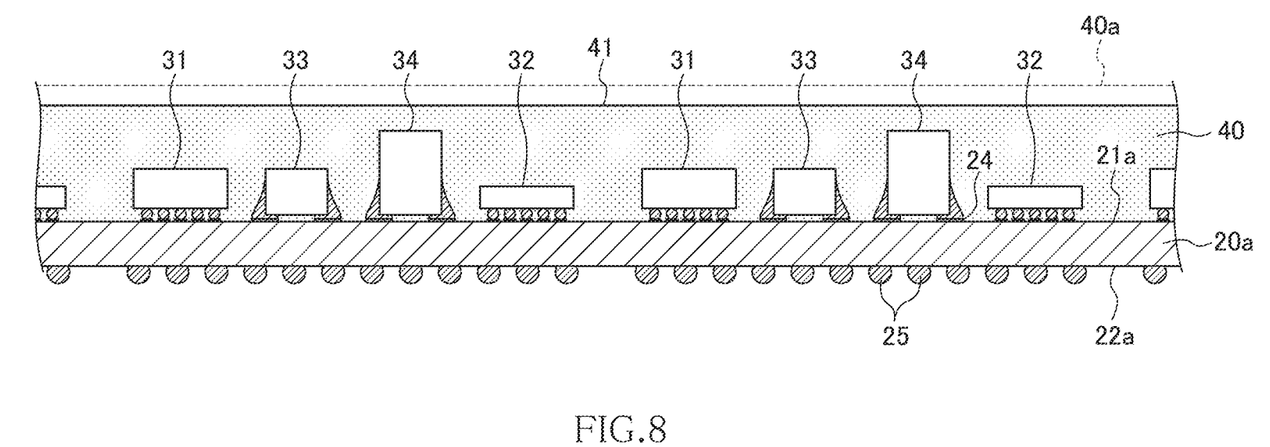
Figure 12B:
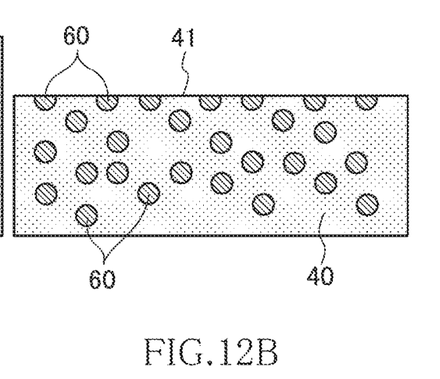

Then, as illustrated in FIG. 8, the surface 40a of the mold member 40 is subjected to lapping or grinding to reduce the thickness of the mold member 40 to a thickness defined by the specification or the like (step S3). As a result, the surface layer 43 is removed as illustrated in FIG. 12B, and a large number of the metal magnetic particles 60 are exposed to the upper surface 41 of the mold member 40. In addition, the upper surface 41 of the mold member 40 is roughened to some degree by the lapping, so that adhesion between the mold member 40 and the electromagnetic wave shield 50 is improved.

Figure 9:
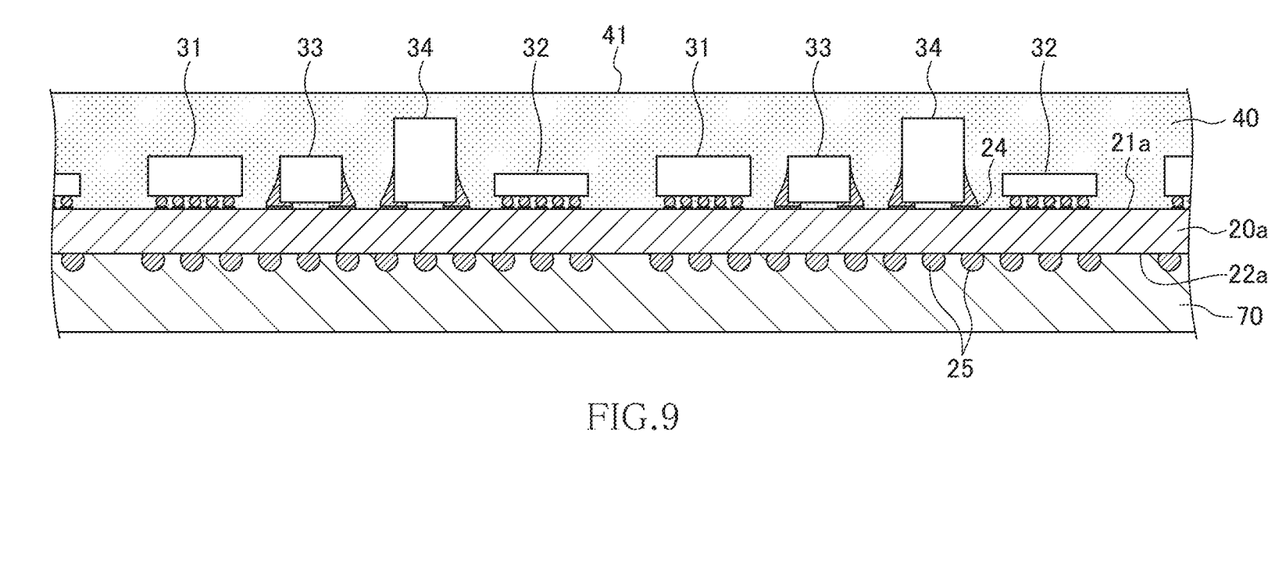

Then, as illustrated in FIG. 9, a masking tape 70 is attached to a rear surface 22a side of the aggregate substrate 20a (step S4). Then, as illustrated in FIG. 10, the mold member 40 and aggregate substrate 20a are subjected to dicing in the vertical direction to obtain a plurality of individualized semiconductor packages 10 (step S5).

Figure 10:
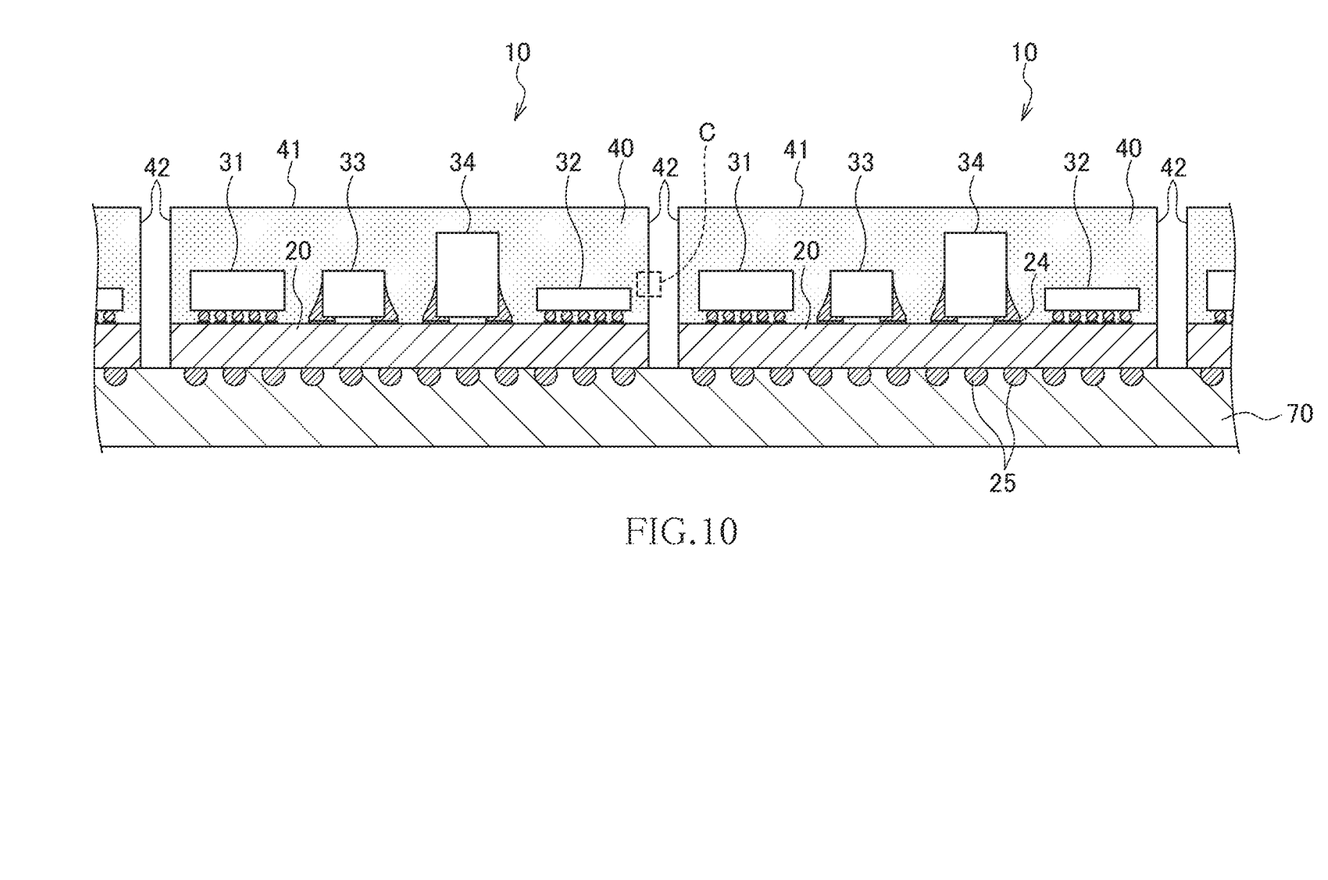
Figure 13:
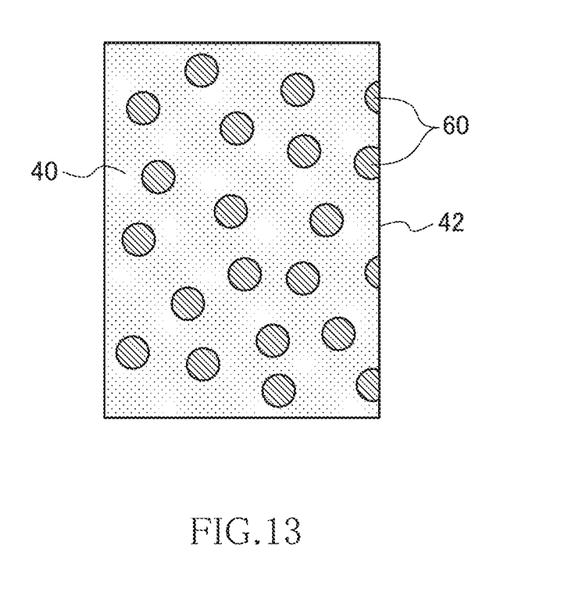
FIG. 13 is an enlarged view of a region C illustrated in FIG. 10.

FIG. 13 is an enlarged view of a region C illustrated in FIG. 10. In the example of FIG. 13, the metal magnetic particles 60 each having a spherical shape are used. As illustrated in FIG. 13, the metal magnetic particles 60 are exposed to the side surface 42 of the mold member 40 after dicing as well as to the upper surface 41.

Figure 11:
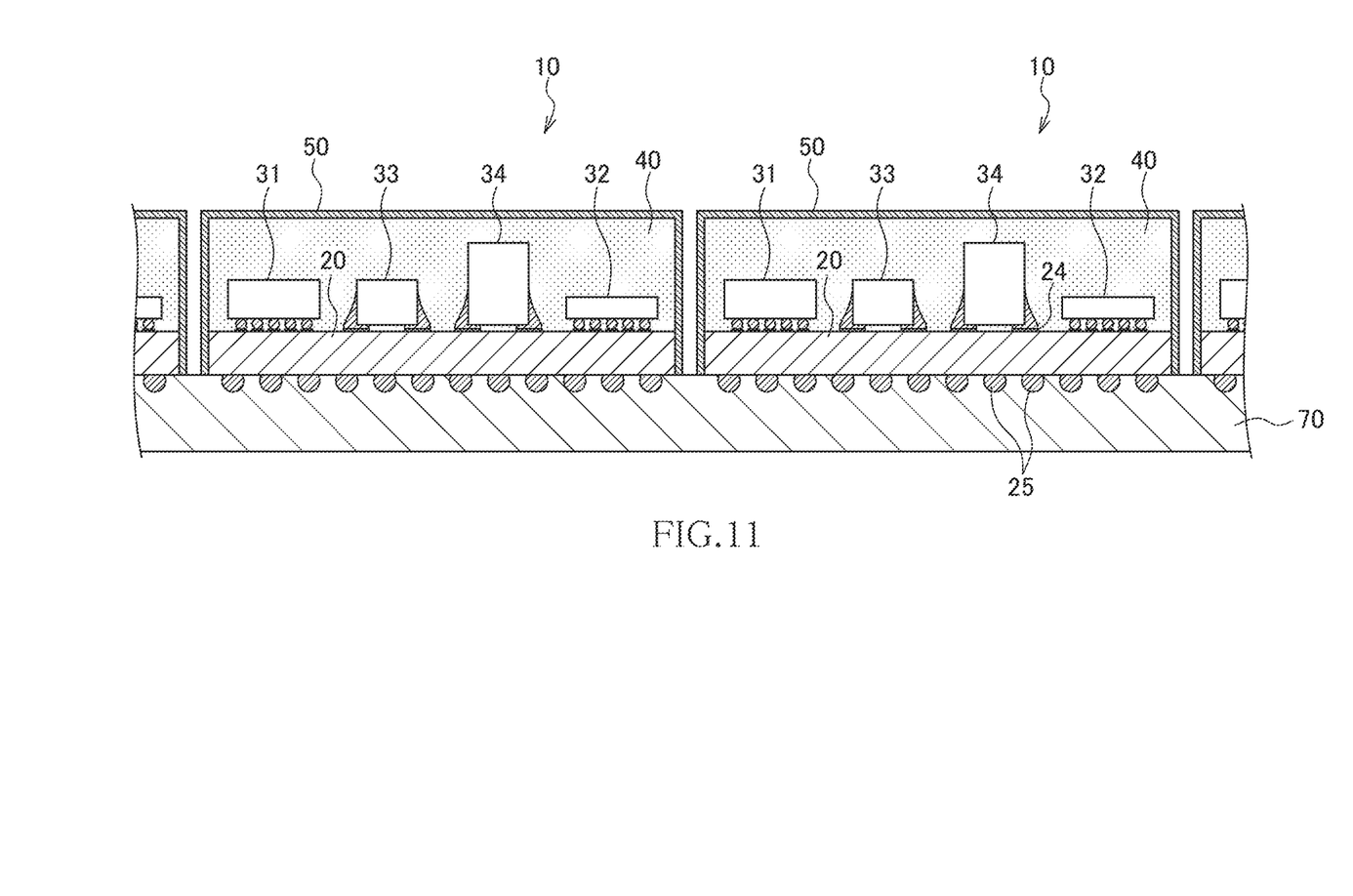

Then, as illustrated in FIG. 11, electroless plating is performed in a state where the plurality of semiconductor packages 10 are retained on the masking tape 70 to thereby obtain the electromagnetic wave shield 50 formed of a metal film (step S6). As a result, the surfaces 41, 42 of the mold member 40 and the side surface 23 of the package substrate 20 are covered by the electromagnetic wave shield 50.

In general, when the electroless plating is to be performed, a catalyst such as palladium needs to be added to a plating solution. In the present embodiment, the metal magnetic particles 60 are exposed to the surfaces 41, 42 of the mold member 40 to serve as the catalyst. Thus, the electroless plating can be performed using a plating solution not added with the catalyst or a plating solution in which the additive amount of the catalyst is significantly reduced. Further, the electromagnetic wave shield 50 formed by the electroless plating is brought into contact with the metal magnetic particles 60 exposed to the surfaces 41, 42 of the mold member 40, allowing achievement of high adhesion.

Then, the masking tape 70 is removed, and thus the semiconductor package 10 illustrated in FIG. 1 can be obtained (step S7).

As described above, in the present embodiment, the electromagnetic wave shield 50 is formed on the surface to which the metal magnetic particles 60 have been exposed by the lapping and dicing, so that it is possible not only to achieve a high noise shielding effect, but also to prevent falling-off of the metal magnetic particles 60.

It is apparent that the present invention is not limited to the above embodiments, but may be modified and changed without departing from the scope and spirit of the invention.

For example, in the above embodiment, the upper surface 41 and side surfaces 42 of the mold member 40 are covered by the electromagnetic wave shield 50; however, in the present invention, the side surfaces 42 may not necessarily be covered by the electromagnetic wave shield 50, but it is sufficient to cover at least the upper surface 41 by the electromagnetic wave shield 50. For example, when the semiconductor packages are to be individually produced without the use of the aggregate substrate, the metal magnetic particles 60 are not always exposed to the side surfaces 42 of the mold member 40. So, in this case, it is not necessary to take into account the falling-off of the metal magnetic particles 60 from the side surfaces 42.

What is claimed is:
1. A semiconductor package comprising:
a package substrate having a main surface;
a plurality of semiconductor devices mounted on the main surface of the package substrate;
a mold member formed on the main surface of the package substrate so as to cover the semiconductor devices, the mold member having an upper surface substantially parallel to the main surface of the package substrate; and
an electromagnetic wave shield formed on the upper surface of the mold member,
wherein the mold member comprises a mold resin and metal magnetic particles dispersed in the mold resin, and
wherein the metal magnetic particles are exposed to the upper surface of the mold member.
2. The semiconductor package as claimed in claim 1,
wherein the mold member further has side surfaces substantially perpendicular to the main surface of the package substrate,
wherein the metal magnetic particles are further exposed to the side surfaces of the mold member, and
wherein the electromagnetic wave shield is further formed on the side surfaces of the mold member.
3. The semiconductor package as claimed in claim 1, wherein the semiconductor devices include a first semiconductor device having a first functional block that is a source of electromagnetic wave noise and a second semiconductor device having a second functional block including an analog circuit whose signal processing characteristics is deteriorated by the electromagnetic wave noise.

4. The semiconductor package as claimed in claim 3, wherein both of the first and second functional blocks are a power amplifier.

5. The semiconductor package as claimed in claim 3, wherein the first functional block is a memory, and the second functional block is a power amplifier.

6. The semiconductor package as claimed in claim 1, wherein the metal magnetic particles have a flat shape and dispersed in the mold resin such that a planar direction thereof is substantially parallel to the main surface of the package substrate.

7. The semiconductor package as claimed in claim 1, wherein the metal magnetic particles have a spherical shape.

8. The semiconductor package as claimed in claim 1, wherein the electromagnetic wave shield is a metal film formed by plating.

9. A method for manufacturing a semiconductor package, the method comprising:
mounting a plurality of semiconductor devices on a main surface of a package substrate;
forming, on the main surface of the package substrate, a mold member including a mold resin and metal magnetic particles dispersed in the mold resin so as to cover the plurality of semiconductor devices;
grinding an upper surface of the mold member substantially parallel to the main surface of the package substrate to expose the metal magnetic particles to the upper surface; and
covering the upper surface of the mold member by an electromagnetic wave shield.

10. The method for manufacturing the semiconductor package as claimed in claim 9, further comprising dicing the mold member to expose the metal magnetic particles to side surfaces of the mold member substantially perpendicular to the main surface of the package substrate,
wherein the side surfaces of the mold member is further covered with the electromagnetic wave shield.

11. The method for manufacturing the semiconductor package as claimed in claim 9, wherein the covering is performed by electroless plating.

12. The method for manufacturing the semiconductor package as claimed in claim 11, wherein the electroless plating is performed using a plating solution free from catalyst.

13. A semiconductor package comprising:
a substrate;
a semiconductor device mounted on the substrate;
a mold member embedding the semiconductor device, the mold member including metal magnetic particles made of a first metal material; and
a shield layer formed on the mold member, the shield layer is made of a second metal material,
wherein a part of the metal magnetic particles is in contact with the shield layer without an intervention of a dielectric material.

14. The semiconductor package as claimed in claim 13, wherein the metal magnetic particles have a flat shape.

15. The semiconductor package as claimed in claim 14, wherein a planar direction the metal magnetic particles is substantially parallel to the package substrate.

16. The semiconductor package as claimed in claim 13, wherein the metal magnetic particles have a spherical shape.

* * * * *